Sept. 21, 1965 W. E. SLUSHER 3,207,962

SEMICONDUCTOR DEVICE HAVING TURN ON AND TURN OFF GAIN

Filed Jan. 2, 1959

INVENTOR.
WILLIAM E. SLUSHER
BY
EZEKIEL WOLF, WOLF & GREENFIELD 3,207,962

SEMICONDUCTOR DEVICE HAVING TURN ON AND TURN OFF GAIN

William E. Slusher, Newton, Mass., assignor, by mesne assignments, to Transitron Electronic Corporation, Wakefield, Mass., a corporation of Delaware Filed Jan. 2, 1959, Ser. No. 784,681
14 Claims. (Cl. 317—234)

Figure 2:
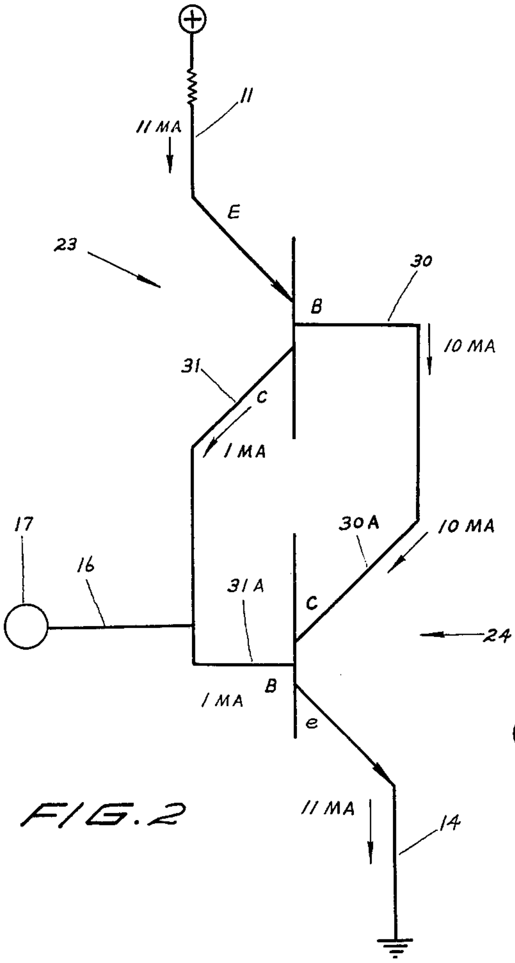

The present invention relates in general to semi-conductor switching devices and more particularly concern a novel bistable semi-conductor device which may be rapidly switched between the conductive and non-conductive states in response to low amplitude control signals. A low power control signal may thus control the delivery of considerably more load power, regardless of whether the current is applied to or removed from the load.

Bistable devices for controlling the delivery of current at high power levels to a load are well known in the art. Examples of such devices are magnetic amplifiers, thyratrons and four-layer diodes which employ the avalanching effect to change between conducting and non-conducting states. The magnetic amplifier is limited to operation at relatively low frequencies. The thyratron and prior art four-layer diodes, while capable of much higher speed operation and responsive to a low-power signal for controlling the delivery of current to a load, require a control signal of much higher power to interrupt the flow of load current.

Accordingly, the present invention contemplates and has as an important object selectively controlling the delivery of a relatively large current to a load with a much smaller amplitude control signal, regardless of whether the delivery of current to the load is initiated or interrupted in response to the control signal.

It is another object of the invention to switch load currents in accordance with the preceding object, even at relatively high operating speeds.

It is a further object of the invention to provide a stable sensitive bistable semi-conductor device in accordance with the preceding objects, which responds to low amplitude control signals to maintain delivery or non-delivery of load currents in accordance with the last-named control signal.

It is a further object of the invention to provide a bistable semi-conductor device in accordance with the preceding object which is relatively insensitive to temperature variations, minimizes power consumption, is rugged, compact, light-weight, and relatively easy to fabricate.

According to the invention, means are provided defining emitter, base and collector regions of first and second semi-conductor devices, one being PNP device, the other, an NPN device. The two devices are arranged so that each emitter carries the full load current when conducting. Means for positively feeding back signals from each device to the other is provided so that the change between conducting and non-conducting states of both devices is accelerated. An input terminal for receiving a control signal is connected to the positive feed-back means. A control signal of proper polarity may then be injected into the positive feed-back means to control the state of the two devices.

The gain factor, or beta, of one of the devices is much smaller than that of the other, specifically less than unity, the product of the gain factors of the two devices being greater than unity. This choice of gain factors enables a small amplitude control signal of one polarity to render both devices conductive while a control signal of opposite polarity, but also of small amplitude, renders both devices non-conductive.

Figure 1:
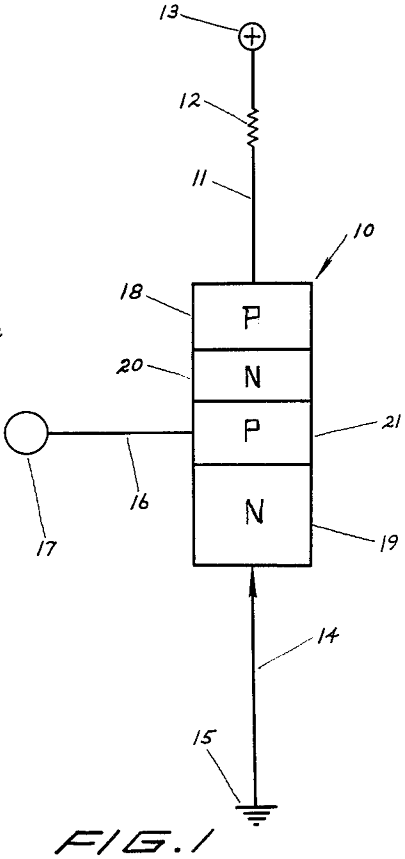

Other features, objects and advantages of the invention will become apparent from the following specification when read in connection with the accompanying drawings, in which:

FIGURE 1 is a diagrammatic representation of a four-layer semi-conductor device incorporating the principles of the invention; and FIGURE 2 is a schematic circuit diagram of a two-transistor equivalent of the device shown in FIGURE 1.

With reference now to the drawing, and more particularly FIGURE 1 thereof, there is shown a four-layer semi-conductor device 10 arranged according to the invention. The layers may be formed for example, of germanium, silicon, or silicon carbide with selected amounts of impurities to obtain alternating N and P layers. A lead 11 carries a load current between the four-layer device 10 and the load resistor 12. The other end of the resistor 12 is connected to a positive terminal 13. The opposite end of four-layer device 10 is connected by a lead 14 to a point of ground or reference potential 15. An intermediate layer of the four-layer device 10 is connected by a lead 16 to a control signal input terminal 17.

The two extreme layers 18 and 19, of opposite conductivity, are connected to leads 11 and 14 respectively. The two intermediate layers 20 and 21 are of opposite conductivity to each other and the adjacent extreme layers. Intermediate layer 21 is connected to lead 16.

A first semi-conductor device is formed by layers 18, 20 and 21, defining emitter, base and collector regions respectively. A second semi-conductor device is formed by layers 19, 21 and 20, defining emitter, base and collector regions respectively.

Three P-N junctions are formed between the four layers. The two extreme junctions between layers 18 and 20 and layers 19 and 21 are normally biased in the forward direction by the potential applied between terminal 13 and ground. The intermediate junction formed between layers 20 and 21 is biased in the reverse direction by this potential when no signal is applied to terminal 17.

Referring to FIGURE 2, there is shown a schematic circuit diagram of a two-transistor circuit arranged according to the invention. This circuit is the functional equivalent of the device shown in FIGURE 1. The mode of operation of the device of FIGURE 1 is better understood by considering the circuit of FIGURE 2 in which analogous elements are identified by the same reference numeral. The PNP transistor 23 corresponds to the first semi-conductor device formed by layers 18, 20 and 21. The NPN transistor 24 corresponds to the second semi-conductor device formed by layers 19, 21 and 20. Leads 30 and 30A form a positive feed-back connection between the collector of transistor 24 and the base of transistor 23. Leads 31 and 31A form a positive feed-back connection between the collector of transistor 23 and the base of transistor 24. The control signal input terminal 17 is connected to the junction of leads 31 and 31A by lead 16.

The emitter of transistor 23 receives current from positive terminal 13 through load resistor 12 and lead 11. The emitter of transistor 24 is connected to ground through lead 14.

The properties of a transistor are represented by a number of parameters, one of the more fundamental being the gain factor, beta. Beta is defined as the ratio of a change of current in the collector lead to the current change in the base lead, causing such collector current change. It is convenient to define an overall transfer gain factor, $B_t$, as the ratio of the load current drawn by resistor 12 to the source current which must be inserted into lead 16 to cause delivery of such current to the load or withdrawn from the lead 16 to interrupt the flow of such current to the load. The beta of the first transistor 23, $B_1$, is the ratio of the current in collector lead 31 to the current in base lead 30, required to support the collector current. The beta of the second transistor 24, $B_2$, is the ratio of collector current in lead 30A to the current in the base lead 31A, required to support the collector current.

In describing the mode of operation, it is convenient to assume that both transistors 23 and 24 are initially non-conductive. If a current $I_S$ is inserted into lead 16, collector lead 30A draws a current $B_2I_S$ through the base lead 30, rendering the transistor 23 conductive. This transistor delivers a current through collector lead 31 of $B_1B_2I_S$, which is positively fed back to the base lead 31A of transistor 24 to reinforce the current inserted through lead 16. If $B_2B_1$ is greater than unity, the source current may now be removed and the two transistors will remain conductive. As in prior art devices, the control signal source current need only be large enough to render transistors 23 and 24 sufficiently conductive so that the product $B_2B_1$ is greater than unity. The transistors then rapidly reach saturation which is determined essentially by the ratio of the source potential 13 to the value of load resistor 12, this load resistor generally being much greater than the impedance presented by transistors 23 and 24 when conducting.

By choosing $B_1B_2$ greater than unity and $B_1$ less than unity, not only will a small source signal initiate the flow of current to the load, but a small signal will also control interruption of current to the load. This will be better understood from the following consideration. Another fundamental quantity for representing transistor characteristics is the current gain, alpha, defined as the ratio of collector current to emitter current. From the definition of beta, it is equal to alpha/1−alpha. If beta is high, alpha is very nearly unity. When alpha is very small, beta is very small.

If $B_1$ is chosen to be small, then the alpha of transistor 23 is also very small. The entire load current passes through the emitter of transistor 23 but only a small fraction thereof is withdrawn through collector lead 31 when the alpha is small. Therefore, in order to interrupt the flow of current through the devices, it is only necessary to withdraw this relatively small current through leads 16 and input terminal 17 by a source control signal of appropriate polarity.

Under these conditions the overall gain factor $B_t$, required to interrupt the flow of load current may be determined in the following manner. The relationship between the load current $I_L$, and the collector current $L_C$, of transistor 23 is:

$$I_L=(1/B_1+1)^{I_C}$$

The relationship between the collector current, $I_C$, of transistor 23, and the minimum signal current $I_S$, which must be withdrawn through lead 16 is to cut off the transistors is:

$$I_S=\left(\frac{1}{1-B_1B_2}\right)^{I}$$

From the above relations the value of overall gain factor, $B_t$, for cutting off the transistors, may be as high as $$B_t=\frac{(1/B_1+1)}{(1-1/B_1B_2)}$$

As a practical matter $B_1B_2$ is generally much greater than one so that $B_t$ is very nearly expressed as $$1/B_1+1$$

for cutting off the transistors. This is an especially significant result since it shows that the turn off $B_t$ may be controlled independently of the turn on $B_t$.

Specific values may be applied to the currents flowing in the circuit of FIG. 2 to illustrate the principles of the invention. With one milliamp in line 31 and 10 milliamps in line 30 in the directions indicated, a current of 11 milliamps flows in line 11. This occurs if $B_1=0.1$ for transistor 23.

In transistor 24, a collector current of 10 milliamps flows in line 30A. The base current under equilibrium conditions is 1 milliamp and the emitter current in lead 14 is 11 milliamps. With a gain factor $B_2$ of 100, a current of 0.1 milliamp must flow in base lead 31A in order to support conduction. Therefore, if only slightly more than 0.9 milliamp is withdrawn through lead 16, the two transistors are cut off and remain cut off until a control current of sufficient amplitude is inserted into lead 16.

In a typical device, actually constructed, $B_1$ was approximately within the range of $1/15$ to $1/25$. $B_2$ was approximately equal to 200 with the circuit beta being about 10 for both on and off switching. Full conduction was effected in two microseconds while the bistable device was cut off in fifteen microseconds.

Since the definition of beta defines alpha in terms of beta as beta/1+beta, it follows that the alpha corresponding to a $B_1$ of $1/15$ to $1/25$ is substantially $1/15$ to $1/25$, close to but greater than zero, while the alpha corresponding to a $B_2$ of 200 is $200/201$, close to but less than one. The sum of the two alphas is at least equal to $200/201+1/25$, a sum slightly greater than one and less than 1.1. For a description of how to establish a specific gain factor, reference is made to Hunter, Handbook of Semiconductor Electronics (McGraw-Hill, 1956), pp. 10–5 to 10–10.

For additional details concerning the fabrication of specific devices, reference is made to Transistor Technology by Members of the Technical Staff of the Bell Telephone Laboratories, volumes I, II and III (D. Van Nostrand 1958). Chapter 11 of volume I describes principles of fabrication. Chapter 5 of volume II describes the design of junction triodes. Page 306 gives a sample calculation of beta. Page 438 et seq. reprints Moll, Tanenbaum, Goldey and Holonyak, P-N-P-N Transistor Switches in 44 Proceedings of the IRE 1174 (September 1956). Chapter 8D of volume III describing fabrication techniques includes a reprint of Tanenbaum and Thomas, Diffused Emitter and Base Silicon Transistors in 35 Bellsyst Tech J 1 (January 1956) referred to by the prceding four authors as describing diffusion and alloying techniques suitable for forming the p-n-p-n transistor described in the preceding article.

Reference is also made to Mackintosh, The Electrical Characteristics of Silicon P-N-P-N Triodes in 45 Proceedings of the IRE 1229 (June 1958) and Aldrich and Holonyak, Multiterminal P-N-P-N Switches in id. 1236.

The circuit beta is defined as the ratio of switched load current to switching control current. The circuit beta of ten is somewhat less than the maximum available values computed from the equations set forth above. By using a control switching current slightly larger than required for switching, operating stability is improved and switching time reduced.

A bistable semi-conducting device has been described for rapidly and selectively controlling the flow of a relatively large signal current with a much smaller control signal current. The control current required for turning the device off may be adjusted independently of the control current required to turn the device on by appropriate choice of $B_1$ and $B_2$ in accordance with the equation discussed above.

The examples described herein show an upper PNP device in series with a lower NPN device with the polarities appropriate for such an arrangement. It is evident that the invention is operative if the position of the devices are exchanged with an appropriate reversal of power supply potential.

Numerous other modifications of and departures from the specific embodiments described herein will now be apparent to those skilled in the art without departing from the inventive concepts. Consequently, the invention is to be construed as limited only by the spirit and scope of the appended claims.

What is claimed is:

1. A bistable circuit comprising, first and second semi-conductor devices, characterized by first and second gain factors respectively, a current source, an input terminal, means for coupling said current source across said first and second semi-conductor devices, means for positively feeding back signals from each semi-conducting device to the other to accelerate change between conductive and non-conductive states of said devices, means for coupling said input terminal to said feed-back means whereby a signal of one polarity applied thereto renders both said devices conductive while a signal of opposite polarity renders both said devices non-conductive, means for establishing the gain factor of one of said devices as less than one and the gain factor of the other of said devices as more than one, whereby said signals of opposite polarity applied to said input terminal may be of relatively small amplitude and still effect said changes in state, the product of said gain factors being greater than one.

2. A bistable circuit in accordance with claim 1, wherein said first semi-conducting device comprises two P layers of semi-conductor material separated by an N layer of semi-conductor material and said second semi-conductor device comprises two N layers of semi-conductor material separated by a P layer of semi-conductor material, said separating layers being connected to a layer of the same type in the other of said device, said input terminal being connected to one of said separating layers.

3. A semi-conductor bistable circuit comprising, semi-conductor layers defining emitter, base and collector regions in PNP and NPN semi-conductor devices, the collector region of each semi-conductor device being connected to the base region of the other, a current source connected between said PNP device emitter region and said NPN device emitter region, and an input terminal connected to the base region of one of said devices, means for establishing the gain factor of said one device as much less than unity and the gain factor of the other of said devices as more than unit, the product of said gain factors being greater than one.

4. A bistable circuit in accordance with claim 3, the overall gain factor for rendering said devices nonconductive being substantially one more than the reciprocal of the gain factor of said one device.

5. An electrical semi-conductor device comprising, semi-conductor layers defining emitter, base and collector regions in PNP and NPN semi-conductor devices, the collector region of each of said PNP and NPN devices being connected to the base region of the other, and an input terminal connected to the base region of one of said devices, means for establishing the gain factor of said one device being less than unity and the gain factor of the other of said devices as more than unity, the product of said gain factors being greater than one.

6. A semi-conductor bistable circuit comprising, means defining three P-N junctions effectively connected in series, means for normally biasing the two extreme ones of said junctions in the forward direction and the intermediate junction in the reverse direction, and control means for applying a biasing signal across one of said extreme junctions, said intermediate junction and said one extreme junction defining a semi-conducting device having a first gain factor, means for establishing said first gain factor as greater than unity, said intermediate junction and said other extreme junction defining a semi-conducting device having a second gain factor less than unity, the product of said first and second gain factors being greater than unity.

7. A bistable circuit comprising PNP and NPN semi-conductor devices, each having base, emitter and collector semi-conducting regions, the base region of each device being connected to the collector region of the other, means for applying a control signal to said connected-together base and collector regions, a source of fixed potential, a load impedance, and means for applying said fixed potential through said load impedance across said emitter regions of said devices to normally forward bias the junctions between the emitter and base regions of both said devices, means for establishing the gain factors of said devices as respectively greater and less than unity, the product of said gain factors being greater than unity.

8. A semi-conductor device of four consecutive adjacent layers of alternate P and N type semi-conductor material, a terminal at each end layer and a terminal at an intermediate layer, said layers forming the analytical equivalent of two transistors with each of said transistors formed of three consecutive layers of said material with said intermediate layers forming common portions of both of said transistors, said transistors arranged with the base of one connected to the collector at the other end, the emiters connected respectively to said end layer terminals, said third terminal being connected to the base of one of said transistors, means for establishing the beta of one of said transistors as less than unity, means for establishing the other transistor beta at a value so that the product of the other transistor beta with said one transistor beta is greater than unity.

9. A semi-conductor device having four consecutive layers of alternate P and N type material, and means for establishing the beta of a group of three adjacent layers greater than unit and the beta of a second differently constituted group of three adjacent layers less than unity, the product of said betas being greater than unity.

10. A semi-conductor device comprising two groups of semi-conductor material forming first and second transistors respectively, each group having alternate layers of P and N type material defining at least bases and collectors, means for establishing the beta of each group as respectively less and greater than unity, the product of said betas being greater than unity.

11. A semiconductor translating device comprising a semiconductor body including four zones arranged in succession, contiguous zones being of opposite conductivity type thereby forming a PNP semiconductor device, low resistance connections to each terminal zone and to one of said intermediate zones, the other intermediate zone being free of any connection, the effective alpha of one of the three contiguous zones being close to but less than one, and the effective alpha of the other three contiguous zones being close to but greater than zero, the sum of said alphas being only slightly greater than one.

12. A PNPN semiconductor triode switch comprising a semiconductor body including four zones arranged in succession, contiguous zones being of opposite conductivity type, a low resistance connections to each terminal zone and to one of said intermediate zones, the other intermediate zone being free of any connection, the effective alpha of the included three-zone element having the connection to its base zone at least nine times the effective alpha of the other included three-zone element, the sum of said alphas being less than 1.1.

13. A PNPN semiconductor triode switch comprising a semiconductor body including four zones arranged in succession, contiguous zones being of opposite conductivity type, low resistance connections to each terminal zone and to one of said intermediate zones, the other intermediate zone being free of any connection and having means whereby the effective alpha of the three-zone element including said contiguous terminal zone is not greater than 0.10, the effective alpha of the other three-zone element being greater than 0.90 but less than 1.0.

14. A PNPN semiconductor triode switch comprising a semiconductor body including four zones arranged in succession, contiguous zones being of opposite conductivity type, a first low resistance connection to one of said terminal zones, a second low resistance connection to the intermediate zone contiguous to said one terminal zone and a third low resistance connection both to the other terminal zone and to the other intermediate zone contiguous to said other terminal zone, said other intermediate zone being free of any other connections and having means whereby the effective alpha of the three-zone element including said contiguous zone is not greater than 0.1, the effective alpha of the other three-zone element being greater than 0.9 but less than one.

References Cited by the Examiner

UNITED STATES PATENTS

| | | | |
|---|---|---|---|
| 2,655,610 | 10/53 | Ebers | 307—88.5 |
| 2,838,617 | 6/58 | Tummers | 179—171 |
| 2,864,985 | 12/58 | Beck | 307—88.5 |
| 2,877,359 | 3/59 | Ross | 307—88.5 |
| 2,890,353 | 6/59 | Van Overbeek | 307—88.5 |
| 2,896,094 | 7/59 | Moody | 307—88.5 |
| 2,904,758 | 9/59 | Miranda | 307—88.5 |

OTHER REFERENCES

Handbook of Semiconductor Electronics, by Hunter, pp. 4–5 and 10–5 to 10–10.

JOHN W. HUCKERT, *Primary Examiner.*

SIMON YAFFEE, GEORGE N. WESTBY, *Examiners.*